(12) United States Patent
Harrison et al.

(10) Patent No.: US 7,445,968 B2
(45) Date of Patent: Nov. 4, 2008

(54) METHODS FOR INTEGRATED CIRCUIT MODULE PACKAGING AND INTEGRATED CIRCUIT MODULE PACKAGES

(75) Inventors: Jose Harrison, North Andover, MA (US); Nicholas Nunns, Amherst, MA (US); William Vaillancourt, Methuen, MA (US)

(73) Assignee: SiGe Semiconductor (U.S.), Corp., Methuen, MA (US)

( * ) Notice: Subject to any disclaimer, the term of this patent is extended or adjusted under 35 U.S.C. 154(b) by 257 days.

(21) Appl. No.: 11/304,826

(22) Filed: Dec. 16, 2005

(65) Prior Publication Data
US 2007/0138614 A1    Jun. 21, 2007

(51) Int. Cl.
*H01L 21/44* (2006.01)
*H01L 21/48* (2006.01)

(52) U.S. Cl. .................. 438/124; 438/112; 438/122; 438/127; 257/660; 257/E23.114

(58) Field of Classification Search .............. 438/124, 438/127, 108, 112, 122; 257/659, 660, 778; 257/60, E23.114
See application file for complete search history.

(56) References Cited

U.S. PATENT DOCUMENTS

| | | | | |
|---|---|---|---|---|
| 5,639,989 A | * | 6/1997 | Higgins, III | 174/386 |
| 6,292,194 B1 | * | 9/2001 | Powell, III | 345/582 |
| 6,294,731 B1 | * | 9/2001 | Lu et al. | 174/388 |
| 6,649,446 B1 | * | 11/2003 | Goetz et al. | 438/110 |
| 6,653,730 B2 | * | 11/2003 | Chrysler et al. | 257/704 |
| 6,750,082 B2 | * | 6/2004 | Briar et al. | 438/108 |
| 7,259,041 B2 | * | 8/2007 | Stelzl et al. | 438/106 |
| 2003/0230798 A1 | * | 12/2003 | Lin et al. | 257/704 |
| 2004/0231872 A1 | * | 11/2004 | Arnold et al. | 174/35 R |
| 2006/0151203 A1 | * | 7/2006 | Krueger et al. | 174/260 |

OTHER PUBLICATIONS

"CSSP3—The Next Step in Miniature Saw Filter Packaging", The Prismark Wireless Technology Report, May 2004, pp. 30-40.

* cited by examiner

*Primary Examiner*—Nitin Parekh

(57) ABSTRACT

In order to achieve electromagnetic and/or thermal isolation between components in close proximity to each other on a common module substrate, an alternate package and method for manufacturing the package is provided.

Inventive methods utilize a grounded, metal-coated overmold for a IC module package that can provide an alternate thermal path to heat sink high power components generating excess heat energy and/or provide general electromagnetic shielding and isolation between two integrated circuits in very close proximity that are susceptible to electromagnetic interference.

A dielectric layer conformably covers semiconductor dies mounted on a substrate. On some semiconductor dies, a portion of the dielectric layer is removed from the back surface of the semiconductor dies to allow direct contact between the exposed back surface of the dies and a metallization layer forming part of the overmold. This direct contact allows heat energy to be drawn away from the dies. The metallization layer also acts to shield the dies from disruptive electromagnetic energy radiated from other dies in close proximity.

7 Claims, 1 Drawing Sheet

METHODS FOR INTEGRATED CIRCUIT MODULE PACKAGING AND INTEGRATED CIRCUIT MODULE PACKAGES

FIELD OF THE INVENTION

The invention relates to integrated circuit (IC) packaging methods, in particular methods for manufacturing packages having thermal isolation and electromagnetic shielding.

BACKGROUND OF THE INVENTION

In IC manufacturing, in particular manufacturing semiconductor components used in devices such as wireless radios, there is a desire to combine higher levels of functionality with a higher level of integration. In high frequency applications achieving higher levels of integration is hindered by increased interference brought on by devices being in closer proximity. For example, obtaining higher levels of integration can be difficult with radios containing components that are electromagnetically sensitive to interference, such as voltage controlled oscillators (VCO), and power amplification chains that produce electromagnetic radiation that may interfere with VCO functions. It is desirable to provide electromagnetic isolation between the two components so that they may be placed in close proximity to each other with reduced risk of interference.

In high frequency applications, another hindrance to integration is thermal coupling between a heat source such as a power amplifier and thermally sensitive components such as Surface Acoustical Wave (SAW) filters and duplexers, whose performance may be degraded by elevated temperatures generated by the power amplifier. Furthermore, heat generated within the power amplifier can cause problems within the power amplifier itself and require additional circuit complexity to deal with thermal runaway, bias compensation, or calibration compensation.

One traditional manufacturing approach is to secure separate metal "cans" over high power and/or electromagnetically sensitive radio devices to provide the necessary isolation. This manufacturing approach occupies excessive area in the form of a grounded solder ring (also known as a "doghouse"). The "cans" also add undesirable size and cost to the final application and may cause electromagnetic coupling feedback loops.

SUMMARY OF THE INVENTION

In order to achieve electromagnetic and thermal isolation between IC components in close proximity to each other on a common module substrate, an alternate packaging technique is provided.

A semiconductor package provided by the invention utilises a grounded, metal overmold for two unique functions: the first function being an alternate thermal path to heat sink high power components generating excess heat energy and the second function being electromagnetic shielding and isolation between integrated circuits in close proximity that are prone to electromagnetic interference.

According to a broad aspect of the invention there is provided a method for integrated circuit module packaging including mounting multiple semiconductor dies on a substrate, covering the semiconductor dies and substrate with a dielectric layer that conforms to the shape of the semiconductor dies, removing the dielectric layer on at least one semiconductor die exposing a portion of a back surface of the semiconductor die, and covering the dielectric layer of the semiconductor die and the exposed surface of the semiconductor die with a metallization layer, where the metallization layer is coupled to an electrical ground.

According to another broad aspect of the invention there is provided an integrated circuit module package including multiple semiconductor dies, a substrate upon which the semiconductor dies are mounted, a dielectric layer conformably covering each of the semiconductor dies and the substrate and a metallization layer in contact with the dielectric layer. The dielectric layer covering one or more semiconductor dies is removed from a portion of a back surface of the semiconductor dies exposing the portion of the back surface of the semiconductor dies before the metallization layer is applied.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Preferred embodiments of the invention will now be described with reference to the attached drawings in which.

DETAILED DESCRIPTION OF THE PREFERRED EMBODIMENTS

Figure 1:
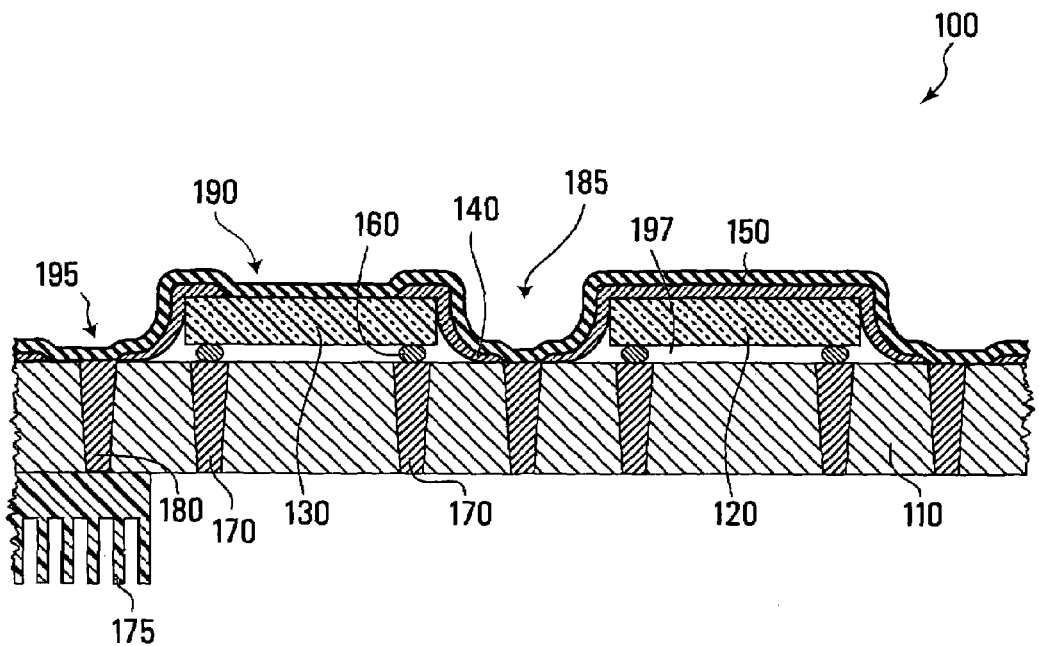
FIG. 1 is a schematic diagram of a cross section of an integrated circuit module package according to an embodiment of the invention.

FIG. 1 shows a cross section of a portion of an integrated circuit (IC) module package, generally indicated at 100, according to an embodiment of the invention. The package includes a common module substrate 110, a first semiconductor die 120, a second semiconductor die 130, each of the semiconductor dies 120,130 mounted to the common module substrate 110 and each semiconductor die including an IC component (not shown). The package includes solder bumps 160 for attaching the first and second semiconductor dies 120,130 to the common module substrate 110. The solder bumps 160 also electrically connect the respective dies to substrate metal tracks or vias. A dielectric layer 140 is shown to cover the common module substrate 110, the first semiconductor die 120 and partially cover the second semiconductor die 130, with the exception of an opening 190 in the dielectric layer 140 on a top surface of the second semiconductor die 130. The application of the dielectric layer 140 creates the potential for having an air gap beneath the die which can have benefits for both semiconductor and acoustic wave devices. A metallization layer 150 is in direct contact with the dielectric layer 140 covering the common module substrate 110 and the first semiconductor die 120. The metallization layer 150 is also in direct contact with the second semiconductor die 130 in the area of the opening 190 of the dielectric layer 140 and in direct contact with the dielectric layer 140 covering the remainder of the second semiconductor die 130.

In the case of FIG. 1, the first semiconductor die 120 has an electromagnetic or thermally sensitive IC component and the second semiconductor die 130 has a power amplifier IC component. More generally, the semiconductor dies can include any type of electromagnetically disruptive IC component that benefits from shielding its electromagnetically disruptive behaviour from other IC components in close proximity, any type of high power IC component that generates excess heat energy that benefits from being able to dissipate that heat energy through direct contact of the metallization layer 150 and the top surface of the high power IC component, and/or any type of electromagnetic or thermally sensitive IC component that benefits from shielding the electromagnetic or thermally sensitive IC component from electromagnetically disruptive behaviour of other IC components in close proximity or that benefits from heat being dissipated from high power IC components in close proximity.

Furthermore, while only two semiconductor dies 120,130 are shown in FIG. 1, it is to be understood that the invention is not limited to two semiconductor dies being mounted on the substrate 110.

The common module substrate 110 is shown to have signal vias 170 through the substrate 110 for communicating signals to and from the semiconductor dies 120,130. The substrate 110 is also shown to have ground vias 180 through the substrate 110. Openings 195 in the dielectric layer 140 over the ground vias 180 allow the metallization layer 150 to directly contact the ground vias 180 and provide electrical connectivity between the metallization layer 150 and the ground vias 180. The ground vias 180 are used for establishing a ground path that can be used for grounding the semiconductor dies 120,130, for grounding the metallization layer to aid in electromagnetic shielding, and/or as a path to a thermal heat sink, for example heat sink 175 coupled to via 180, which in turn is coupled to metallization layer 150.

The substrate 110 may be any one of a number of substrate types, for example a ceramic substrate, a laminate substrate, or a leadframe substrate. In some embodiments the substrate is a combination of one or more different types of substrate material. The substrate 110 may also have a protective coating (not shown) on the bottom surface of the substrate 110, that is the surface opposite to which the semiconductor dies 120,130 are mounted, to protect the substrate 110 during application of the metallization layer 150.

In some embodiments, the dielectric layer 140 is a thin film of acrylic or plastic. In some embodiments, the thin film of acrylic or plastic is attached to the module substrate 110 and dies 120,130 by applying pressure to the surface of the acrylic or plastic covering the substrate 110 and dies 120,130. In some embodiments, the thin film of acrylic or plastic is attached to the module substrate 110 and dies 120,130 by applying vacuum suction through holes (not shown) in the module substrate 110 from underneath the module substrate 110, that is a surface opposite to which the dies 120,130 are mounted to. In some embodiments, after the acrylic or plastic is in place over the module substrate 110 and dies 120,130, the module substrate 110, dies 120,130 and acrylic are cured in an oven at an appropriate temperature, for example approximately 280° C., until the acrylic softens and adheres to the surface of the module substrate 110 and dies 120,130.

While a thin layer of acrylic or plastic may be used for the dielectric layer, it is also within the scope of the invention to use other types of dielectric materials for the same purpose.

In some embodiments, spacing of the dies 120,130 and the manner in which the dielectric layer 140 is applied over the dies 120,130 and substrate 110 results in a physical separation 185 being maintained between each die 120,130 mounted on the substrate 110, which improves thermal isolation between the dies 120,130. As an example, one die is a thermal source, such as a power amplifier and one is temperature sensitive that is, the electrical performance is susceptible to changes in temperature. Typically, the physical gap between the dies is filled with an overmold encapsulant, which may act to conduct heat between the two dies. The conformal nature of the acrylic over the two dies as described above results in an unfilled air gap between the two dies.

In alternative known packaging techniques where flip-chip attachment is not used and the semiconductor die is directly connected to the substrate by bonding the back surface of the die adjacent to the top surface of the substrate, excess heat from the die can be dissipated across this surface to surface bond. However, in a module in which the semiconductor die is mounted to the substrate using flip-chip attachment, a main direct path for excess heat to be dissipated is through the solder bumps used to attach the die to the signal and/or ground via pads of the substrate. The die that is directly connected to the substrate effectively has lower thermal resistance and therefore a lower die temperature overall. The amount of heat, however, that is generated within the die is the same between the two different mounting techniques. The flip-chip attachment method results in a thermal path that has higher thermal resistance (° C./Watt dissipated) and therefore the die temperature is higher. Therefore, by allowing the metallization layer to directly contact a portion of the back surface of the semiconductor die, it is possible to provide an additional thermal path to draw heat away from the semiconductor die.

There is a physical separation between the dies 120,130 and the substrate 110, indicated by reference character 197. Traditional flip chip assembly fills this gap with an electrically non-conductive, but thermally conductive material to aid in dissipating heat and offer some mechanical adhesion to supplement solder bumps 160 used to electrically couple the dies 120, 130 to the substrate 110. In some embodiments, no electrically non-conductive, but thermally conductive material is applied between the dies 120, 130 and the substrate 110. Instead, in some embodiments, the physical separation between the dies 120, 130 and the substrate 110 is left as an air gap. The air gap between the dies 120, 130 and the substrate 110 is advantageous for dies having surface acoustic wave (SAW) components as the air gap allows SAW "fins" to vibrate and resonate freely in air. However, the elimination of the electrically non-conductive, but thermally conductive material reduces the manner in which the dies 120, 130 can dissipate heat energy. As described above, direct contact of the metallization layer with the portion of the back surface of the semiconductor die provides an additional thermal path to draw heat away from the semiconductor die and mitigates this potential problem.

A method for manufacturing an IC module package will now be described with regard to the flow chart of FIG. 2. At step 200, a first step of the method includes mounting at least one semiconductor die on a substrate. In some embodiments, the mounting is performed by flip-chip attachment, also known as Direct Chip Attachment (DCA). In a second step, indicated at 210, the at least one semiconductor die and the substrate are covered with a dielectric layer that conforms to the shape of the at least one semiconductor die. At step 220, a portion of the dielectric layer on a back surface of one or more semiconductor die is exposed. The portion of the dielectric layer on the exposed surface of the one or more semiconductor die may expose as much of the surface as possible to provide the most efficient thermal transfer from the one or more semiconductor die to the metallization layer. At step 230, the dielectric layer on one or more ground vias of the substrate is exposed. Steps 220,230 are implementation specific and can be performed simultaneously or sequentially as desired by the manufacturing process. In some embodiments steps 220,230 are performed by a chemical etching process. Examples of other techniques that could be used to remove the dielectric layer include, but are not limited to laser drilling or ablation. At step 240, the dielectric layer covering the substrate, the at least one semiconductor die, the exposed surface of the one or more semiconductor die, and the exposed ground via bonding pads are covered with the metallization layer, otherwise known as a metal overmold. Methods for performing the deposition of this metal overmold are described in detail below.

Using flip-chip techniques, the semiconductor dies 120, 130 are mounted on the common module substrate 110 face down, that is with a surface considered as the top surface of the semiconductor die during fabrication of a wafer, towards the substrate 110. In some embodiments, the dies 120,130 are coupled to the substrate 110 using the solder bumps 160 that are formed on the bonding pads of the dies 120,130 before performing the flip-chip attachment. In some embodiments, the solder bumps 160 are formed on signal and/or ground via bonding pads on a top surface of the substrate 110 and the dies 120,130 are subsequently attached to the substrate 110. Flip-chip attachment is one manner the dies 120,130 can be attached to the substrate 110, but it is to be understood that other methods for attaching the dies 120,130 to the substrate 110 are within the scope of the invention, for example surface mount technology (SMT) techniques.

In some embodiments of the invention the substrate bonding pads are tungsten covered by electroless nickel and gold. In some embodiments of the invention the semiconductor die bonding pads are a metal alloy including aluminium and copper. More generally, the substrate and semiconductor bonding pads are made of any metal, metal alloy, plated metal or plated metal alloy that provides an appropriate electrical connection between the components.

Subsequent to depositing the dielectric layer on the dies and substrate (step 210), a portion of the dielectric layer is removed from the surface of one or more of the dies (step 220) resulting in an exposed opening, such as opening 190 of FIG. 1. The portion of the dielectric layer that is removed exposes a surface considered to be the bottom or back surface of the semiconductor die during fabrication of a wafer, and which is the opposite side of the semiconductor die that is attached to the substrate as described above.

Exposing the back surface of the die is done for selected dies in which it is beneficial to provide additional heat dissipation from the die. The metallization layer is deposited over the dielectric layer and the exposed back surface of the die so that the metallization layer is in direct contact with the exposed back surface of the die. As a thermally conductive metal is used for the metallization layer, this direct contact of metallization layer and the exposed back surface of the die allows heat generated by the active IC component of the die to be drawn away from the die more effectively.

In addition to removing the portion of the dielectric layer and exposing the back surface of the die, the dielectric layer that covers some or all of the ground vias is removed (step 230), resulting in an opening, such as opening 195 of FIG. 1, that exposes the respective ground via bonding pads. Some or all of the ground vias, in addition to acting as a path to ground on the substrate and/or on a surface that the substrate is mounted to, such as a printed circuit board (not shown), may also be attached to a heat sink. The metallization layer completes the thermal path from the exposed surface of the die to the exposed ground vias to the heat sink.

As mentioned above, examples of types of IC devices on semiconductor dies that benefit from an additional path to the thermal heat sink are high power devices, for example power amplifiers that generate excess heat. By providing a more effective and efficient manner to remove excess heat from such IC devices there is less heat in close proximity to the high power devices themselves as well as less heat in close proximity to thermally sensitive IC devices that are close to the high power devices. Therefore, the risk of problems such as thermal runaway or circuit performance changes due to thermal coupling effects is reduced, as is the need for additional circuitry to deal with such issues as bias compensation or calibration compensation.

In some embodiments, portions of the dielectric layer removed from the back surface of select semiconductor dies and removed from the ground vias (step 230 and 240, respectively) are performed using a chemical etch. However, it is to be understood that other types of removal methods known to those skilled in the art that are non-destructive to the substrate and dies are also considered to be within the scope of this invention.

As described above, the dielectric layer that covers the ground via bonding pads is removed (step 230) exposing the ground via pads. When the metallization layer is applied on top of the dielectric layer and openings in the dielectric layer (step 240 of FIG. 2), the metallization layer completes an electrical path to ground, allowing the metallization layer to form an effective electromagnetic shield for each semiconductor die.

In some embodiments of the invention, the metallization layer is a layer of a metal or a metal alloy that is deposited using a known sputtering process, for example sputtering techniques used in SAW filter and duplexer devices for providing package hermiticity that are performed in a vacuum chamber. More generally, the metallization layer can be applied using other methods besides sputtering. Other examples of techniques used to apply the metallization layer include, but are not limited to electron beam evaporation, chemical deposition using various metal-organic compounds, or electrolytic plating methods.

In some embodiments, the metal used in the sputtering process is copper. In some embodiments the metal alloy is a copper alloy that includes copper and nickel. More generally, the metal used in the sputtering process is any metal or metal alloy that has a suitable electrical conductivity and thermal conductivity, such that the metallization layer functions as a thermal path and/or electromagnetic shield as described herein.

A benefit of the sputtering process is that it can be performed in batch processing for high volume manufacturing.

The layer identified as the metallization layer may also be a layer of superconducting material as deposition technology and material qualities for such types of material improve.

Figure 2:
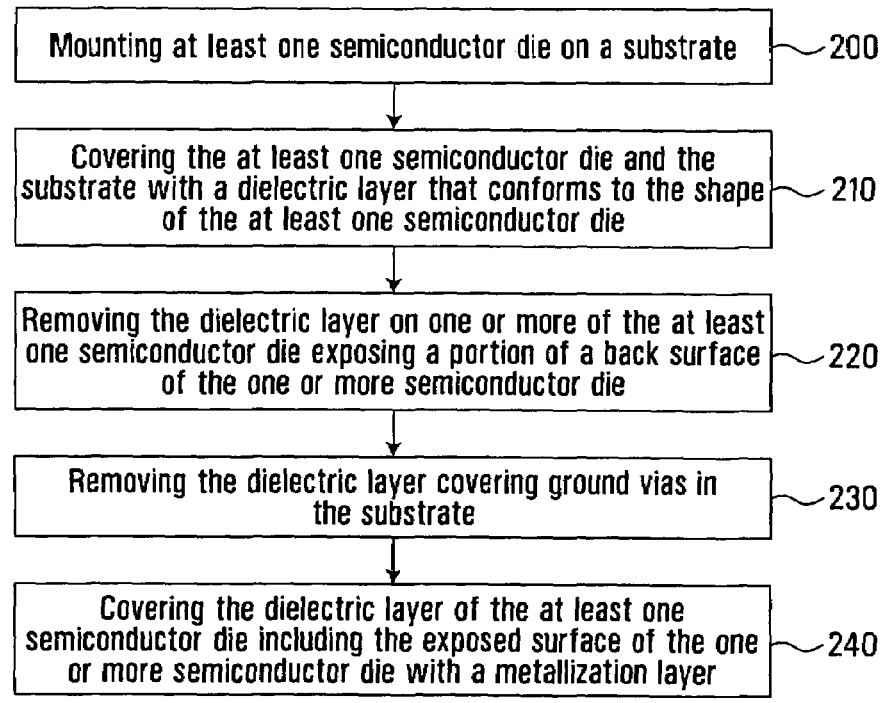
FIG. 2 is a flow chart for a method of manufacturing an integrated circuit module package according to an embodiment of the invention.

As opposed to only depositing the metal or metal alloy on the dielectric layer at step 240 of FIG. 2, multiple layers of different types of material that collectively have the properties of the metallization layer could be used to cover the dielectric layer. For example, a thin film of a thermally conductive material could be deposited on the dielectric layer and then another layer of a material capable of isolating electric radiation could be applied on top of the thermally conductive material.

An example of one particular application to which this invention can be applied is combining a CDMA (code division multiple access) power amplifier and a SAW filter and duplexer into a Front End Module (FEM). The FEM is assembled using flip-chip attachment techniques to mount the components onto a ceramic substrate. The combination of the SAW filter and duplexer reduces size and cost of CDMA FEMs. The use of flip-chip attachment allows both the power amplifier and SAW duplexer to use existing SAW chip scale packaging (CSP) assembly techniques to reduce module package size. This is one specific application, but it is to be understood that an FEM could be manufactured with different types of components and/or different types of substrates as described above.

In existing SAW CSP assembly techniques, a dielectric layer located over an IC device that generates a significant amount of heat is not removed or etched to expose the back of the die and allow the metallization layer to come into contact with it. Generally speaking, the dielectric layer is a poor thermal conductor so while the metallization layer provides an effective electromagnetic interference shield in those existing CSP assembly techniques, it cannot provide a path to dissipate heat generated by the underlying die as described herein because it is physically separated from the heat producing die. Effectively, the thermal path to the metal layer is blocked by the dielectric.

Numerous modifications and variations of the present invention are possible in light of the above teachings. It is therefore to be understood that within the scope of the appended claims, the invention may be practised otherwise than as specifically described herein.

The invention claimed is:

1. A method for integrated circuit module packaging comprising steps in an order of:
   mounting at least one semiconductor die on a substrate;
   covering the at least one semiconductor die and the substrate with a dielectric layer that conforms to the shape of the at least one semiconductor die;
   removing the dielectric layer on one or more of the at least one semiconductor die exposing a portion of a back surface of the one or more semiconductor die;
   covering the dielectric layer of the at least one semiconductor die and the exposed surface of the one or more semiconductor die with a metallization layer, the metallization layer being coupled to an electrical ground wherein the at least one semiconductor die is two or more semiconductor dies and the grounded metallization layer is used for: providing an alternate thermal path to a heat sink coupled to the electrical ground for the two or more semiconductor dies within the module through ground vias in the substrate by directly coupling the heat sink and the metallization layer; and providing electromagnetic shielding and isolation between the two or more semiconductor dies in close proximity within the module.

2. The method of claim 1, wherein covering the dielectric layer with the metallization layer comprises a sputtering process using a metal or a metal alloy.

3. The method of claim 1 further comprising:
   prior to covering the at least one semiconductor die and the exposed surface of the one or more semiconductor die with the metallization layer, removing the dielectric layer covering the ground vias in the substrate to expose the ground vias, the ground vias providing a path for the metallization layer to be coupled to the electrical ground.

4. The method of claim 3, wherein removing the dielectric layer covering ground vias in the substrate comprises utilizing a chemical etching process to remove the dielectric layer.

5. The method of claim 1, wherein removing the dielectric layer on the one or more semiconductor die comprises utilizing any one of a group consisting of a chemical etching process, laser drilling and laser ablation to remove the dielectric layer.

6. The method of claim 1 further comprising depositing a layer of material with high thermal conductivity on the dielectric layer before depositing the metallization layer, at least in the area of the exposed portion of the back surface of the one or more semiconductor die.

7. The method of claim 1, wherein mounting at least one semiconductor die on the substrate comprises attaching the at least one semiconductor die to the substrate using a flip-chip attachment process.

* * * * *